(12) United States Patent
Wang et al.

(10) Patent No.: US 6,867,131 B2
(45) Date of Patent: Mar. 15, 2005

(54) APPARATUS AND METHOD OF INCREASING SRAM CELL CAPACITANCE WITH METAL FILL

(75) Inventors: Zhongze Wang, Boise, ID (US); Chih-Chen Cho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,457

(22) Filed: Aug. 29, 2002

(65) Prior Publication Data

US 2004/0043554 A1 Mar. 4, 2004

(51) Int. Cl.[7] ............................................. H01L 21/44
(52) U.S. Cl. .................... 438/666; 438/685; 438/253; 438/396
(58) Field of Search ............................ 438/597, 253, 438/396, 666, 685

(56) References Cited

U.S. PATENT DOCUMENTS

| | | | |
|---|---|---|---|
| 6,093,661 A | 7/2000 | Trivedi et al. | 438/769 |
| 6,117,760 A * | 9/2000 | Gardner et al. | 438/618 |
| 6,162,693 A | 12/2000 | Wang et al. | 438/303 |
| 6,277,674 B1 | 8/2001 | Wang et al. | 438/132 |
| 6,362,117 B1 * | 3/2002 | Houston | 438/947 |
| 6,380,042 B1 * | 4/2002 | Huang | 438/303 |
| 6,417,546 B2 | 7/2002 | Trivedi et al. | 257/369 |
| 6,420,250 B1 | 7/2002 | Cho et al. | 438/595 |
| 6,448,129 B1 | 9/2002 | Cho et al. | 438/241 |
| 6,507,064 B1 * | 1/2003 | Tang et al. | 257/306 |
| 6,696,355 B2 * | 2/2004 | Dennison | 438/597 |

* cited by examiner

*Primary Examiner*—Amir Zarabian
*Assistant Examiner*—Christy Novacek
(74) *Attorney, Agent, or Firm*—Fletcher Yoder

(57) ABSTRACT

A static random access memory cell with metal fill to form capacitors for increasing the capacitance of the memory cell. More specifically, a semiconductor device including a structure having an upper surface and a contact surface formed at the upper surface of the structure. A dielectric material is formed over the contact surface with a first conductive node and a second conductive node extending beyond the dielectric material. Dielectric spacers are formed around the first and second conductive nodes and conductive elements are formed between the dielectric spacers. The conductive elements and spacers form capacitors without implementing additional masking steps.

29 Claims, 4 Drawing Sheets

APPARATUS AND METHOD OF INCREASING SRAM CELL CAPACITANCE WITH METAL FILL

BACKGROUND OF THE INVENTION

1. Field of the Invention

The present invention relates generally to integrated circuits and, more particularly, to an apparatus and method for increasing cell capacitance in a static random access memory cell.

2. Background of the Related Art

This section is intended to introduce the reader to various aspects of art, which may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In today's high-speed computer systems, the relative size of electronic devices is steadily decreasing while system performance is steadily increasing. Thus, higher performance systems are being designed to consume less space. Accordingly, the electronic components that make up computer systems, such as processors, memory devices, or other peripherals are being designed to occupy less space. For example, memory devices, such as static random access devices (SRAMs), are being fabricated with decreased memory cell size.

As the SRAM's cell size decreases, the associated capacitance of the SRAM cell decreases as well. The critical charge of the SRAM cell is proportional to the capacitance of the cell. Disadvantageously, the decrease in parasitic capacitance in the SRAM cell makes it more susceptible to potential problems, such as soft error failure. Soft error failure is caused when a radioactive particle, such as an alpha particle, hits a junction area in an SRAM cell thereby creating free charges. If the charges created are greater than the critical charge of the SRAM cell, then the information stored in the cell may be lost because the data is corrupted. Depending on the specific information that is stored in the SRAM cells, these errors may impact the system's performance.

One method that is often used to combat soft error failures is to add capacitor plates on top of the SRAM cell to add extra capacitance. Disadvantageously, in adding plates to the top of the SRAM cell, additional photolithography steps may be required to fabricate the additional structure. This increases the time to fabricate the SRAM cells and increases the overall cost of the fabrication process.

BRIEF DESCRIPTION OF THE DRAWINGS

Advantages of the invention may become apparent upon reading the following detailed description and upon reference to the drawings in which.

DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
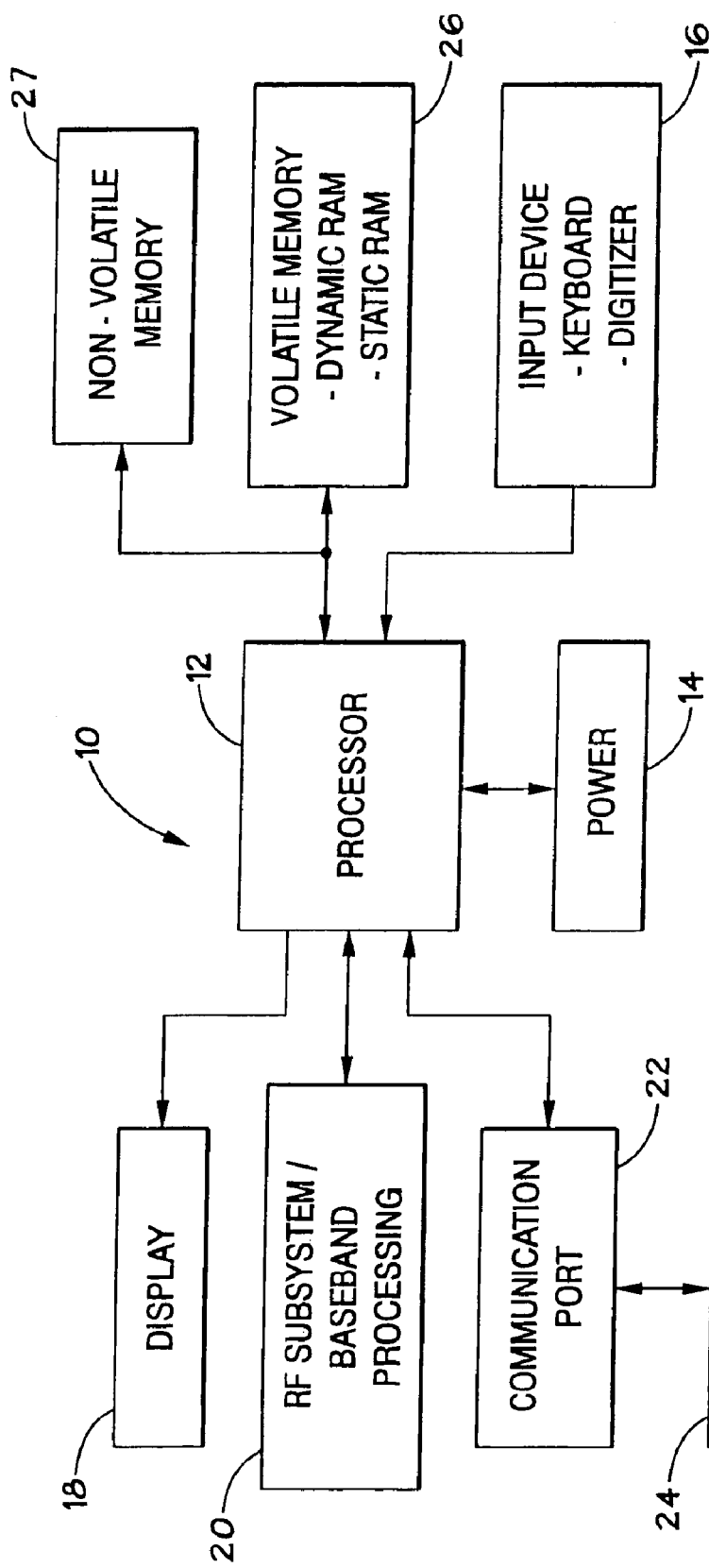
FIG. 1 illustrates a block diagram of an exemplary processor-based device.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, the memory enables the system to operate more efficiently. Generally, the memory is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to non-volatile memory 27. The non-volatile memory 27 may include a read-only memory (ROM), such as an EPROM, and/or flash memory to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 27 may include a high capacity memory such as a tape or disk drive memory.

Figure 2:
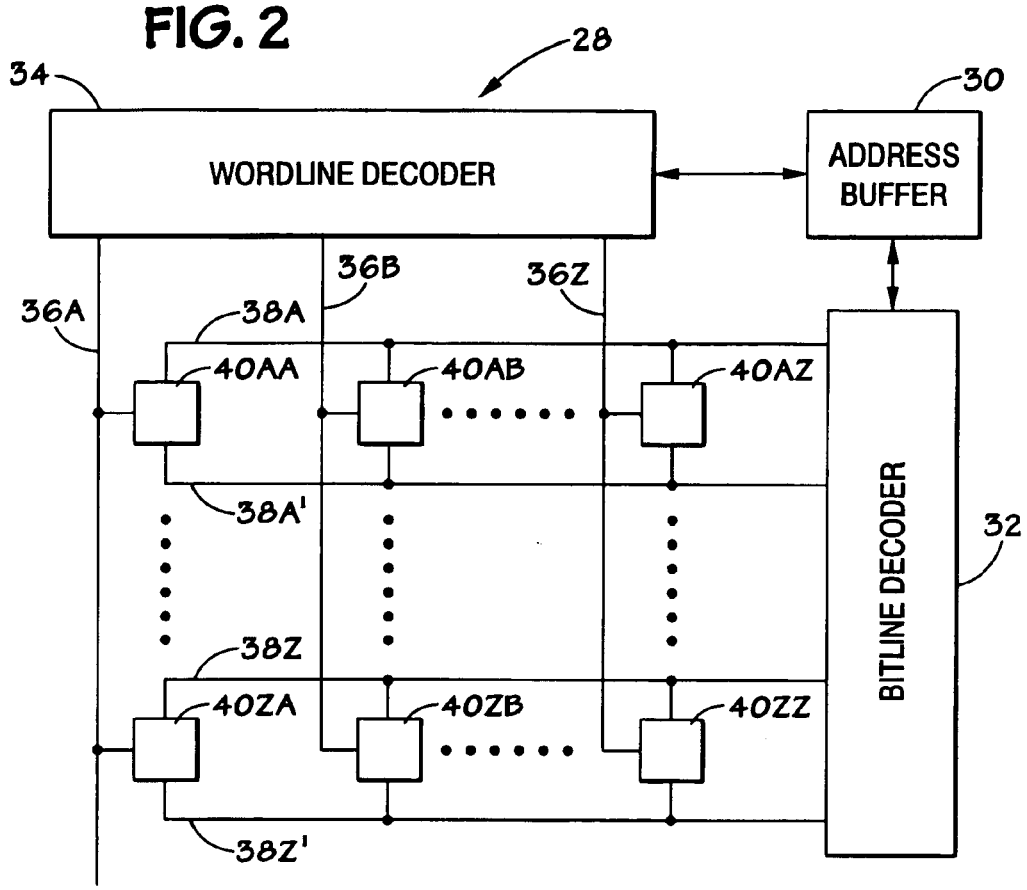
FIG. 2 illustrates a block diagram of an exemplary memory array that may be fabricated in accordance with the present techniques.

As previously described, the volatile memory 26 may include one or more SRAM devices. FIG. 2 is a block diagram illustrating a portion of an SRAM memory array 28, such as a portion of the volatile memory 26, which may be fabricated in accordance with the present techniques. An address buffer 30 is configured to receive address signals. The address buffer 30 is electrically coupled to a bitline decoder 32 and a wordline decoder 34. The bitline decoder 32 and wordline decoder 34 selectively access individual cells in the memory array 28 through conductive rows and columns. Accordingly, the wordlines 36A–36Z connect the wordline decoder 34 to each of the memory cells 40AA–40ZZ. Likewise, each of the bitlines 38A–38Z and complimentary bitlines 38A'–38Z' is connected to the bitline decoder 32 and to each of the memory cells 40AA–40ZZ.

The wordline decoder 34 is used to enable the reading or writing of information into one of the memory cells 40AA–40ZZ. The bitline decoder 32 is used to input the information into one of the memory cells 40AA–40ZZ or to read the information out of one of the memory cells 40AA–40ZZ. In one exemplary mode of operation, the memory array 28 receives an address of a particular memory cell 40 at the address buffer 30. The address buffer 30 identifies one of the wordlines 36 of the particular memory cell 40 corresponding to the requested address and passes the address to the wordline decoder 34. The wordline decoder 34 selectively activates the particular wordline 36 to activate access devices in each memory cell 40 that is connected to the selected wordline 36. The bitline decoder 32 selects the bitline (or bitlines) 38 and 38' of the memory cell 40 corresponding to the requested address. For a write operation, data received by input/output circuitry is coupled to the selected bitline (or bitlines) 38 and 38' and facilitates the programming of the selected memory cell 40 through the access device. The voltage level stored in the cell 40 corresponds to binary data, as can be appreciated by those skilled in the art. For a read operation, data stored in the selected memory cell 40 is coupled to the selected bitline (or bitlines) 38 and 38', amplified by sense amplifiers in the bitline decoder 32, and a corresponding voltage level is provided to an input/output circuit in the bitline decoder 32.

Figure 3:
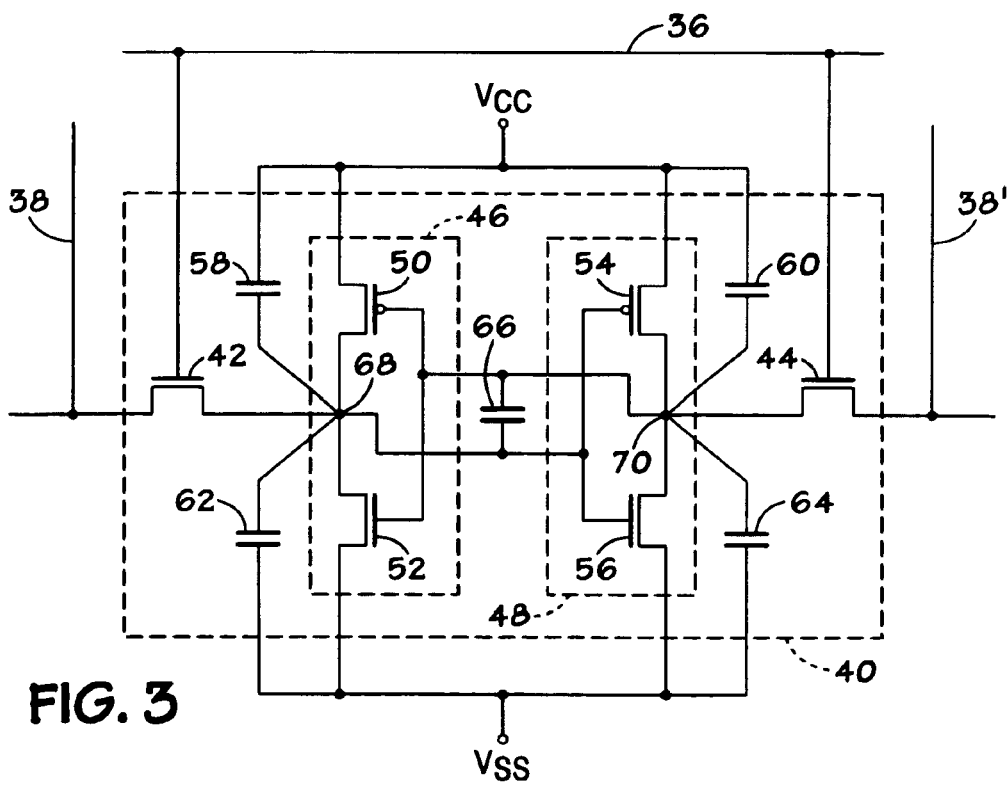
FIG. 3 illustrates a schematic diagram of an exemplary SRAM memory cell of the memory array illustrated in FIG. 2.

FIG. 3 illustrates one exemplary embodiment of a memory cell 40, such as a static random access memory (SRAM) cell. The memory cell 40 may include a number of transistors configured to provide access to the memory cell 40 and store a charge in the memory cell 40. The transistors may be metal-oxide-semiconductor field effect transistors (MOSFETs) or any other suitable transistor.

In one exemplary embodiment, access transistors 42 and 44 are implemented to provide electrical access to the storage portion of the memory cell 40. The gate of each access transistor 42 and 44 is coupled to a wordline 36 such that a control voltage may be applied to the wordline 36 to open the gate of the access transistor 42 and 44. The drain (or source, depending on the mode of operation) of the access transistors 42 and 44 is coupled to respective complementary bitlines 38 and 38'. As can be appreciated, the source (or drain, depending on the mode of operation) of each of the access transistors 42 and 44 is coupled to the storage portion of the SRAM memory cell 40. The storage portion may include inverters 46 and 48, for example. The inverter 46 may comprise a p-channel transistor 50 coupled to a complimentary n-channel transistor 52, for example. Similarly, the inverter 48 may comprise a p-channel transistor 54 coupled to a complimentary n-channel transistor 56, for example. The transistors 50 and 54 may be coupled to a first power supply Vcc, and the transistors 52 and 56 may be coupled to a second power supply or ground Vss to facilitate the functionality of the memory cell 40, as can be appreciated by those skilled in the art. The inverters are coupled together to form a latch that stores a binary voltage value for the bit.

As previously described, as the size of each memory cell 40 decreases, the parasitic capacitance of each memory cell 40 also decreases. Advantageously, capacitors may be implemented, in accordance with the present techniques, to increase the capacitance of the memory cell 40. Typically, the critical charge, i.e., the amount of charge that could alter the contents of the memory cell 40, is equal to the parasitic cell capacitance times a supply voltage that is applied to the cell. With this relationship between the cell capacitance and cell size, it should be clear that a decrease in the SRAM cell size decreases the SRAM cell's capacitance. This reduction in the stored charge makes the SRAM cell more prone to soft error failure. As previously described, soft errors may occur if an alpha particle hits a PN junction within the memory cell 40. The collision of the alpha particle with the PN junction produces electron and hole pairs which may result in a state change of the memory cell 40. Advantageously, by adding extra capacitance to the memory cell 40, the charge stored in the memory cell 40 may be increased, thereby making the memory cell 40 more resistant to soft errors.

Increased capacitance in the SRAM memory cell 40 may be achieved by fabricating a number of capacitors 58, 60, 62, 64 and 66 between the nodes 68 and 70 and the power/ground supplies Vcc and Vss. For example, the capacitor 58 is coupled between the node 68 and Vcc. The capacitor 60 is coupled between the node 70 and Vcc. The capacitor 62 is coupled between the node 68 and Vss. The capacitor 64 is coupled between the node 70 and Vss. The capacitor 66 is coupled between the node 68 and the node 70. Each of the capacitors 58, 60, 62, 64 and 66 may have a capacitance in the range of 0.2 to 1.0 fF, for example. The increase in the overall cell capacitance may range from 10% to 100%, although it is typically selected to range from 30% to 50%. The variation in the cell capacitance and the capacitance of the individual capacitors 58, 60, 62, 64 and 66 may vary depending upon design parameters as discussed below. As can be appreciated, the capacitors 58, 60, 62, 64 and 66 may have different values, depending on the design of the cell.

Figure 4:
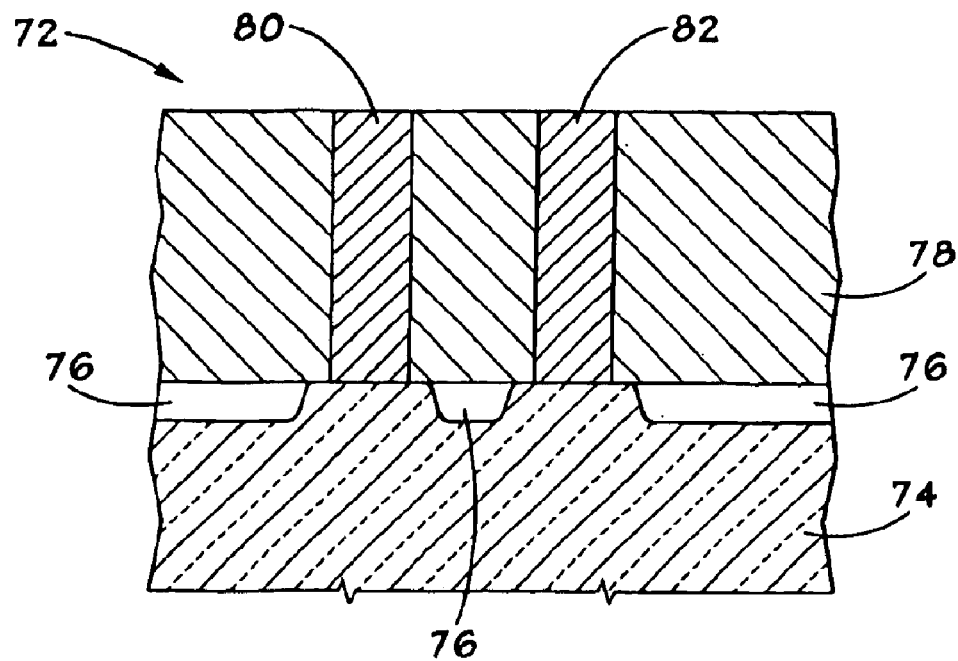
FIGS. 4–8 illustrate a cross-sectional view of the contact region of a memory cell at different stages of fabrication in which capacitors may be fabricated in accordance with the present techniques.

FIG. 4 illustrates a cross-sectional view of a portion of the memory cell 40 generally designated as a structure 72. Specifically, the structure 72 is a cross-sectional view of a contact region present in the SRAM memory cell. The memory cell 40 is generally fabricated on a substrate 74, such as a silicon wafer. The substrate 74 may comprise a number of material layers (not illustrated) which provide semiconductor structures and components in the memory cell 40. Further, the substrate 74 may be the base on which the devices, such as the transistors, are fabricated. However, for simplicity, these devices are not shown. The fabrication of a conventional SRAM device can be appreciated by those skilled in the art.

To provide electrical contact to the underlying integrated circuit devices, contacts or local interconnects are formed to create an electrical path from one layer of the device to other layers of the device. The structure 72 illustrates an exemplary embodiment of a contact region of a portion of a memory cell 40, for example. As can be appreciated, shallow trenches may be formed in the substrate 74. A field oxide 76 may be disposed in the shallow trenches to provide isolation between the contacts. A dielectric layer 78 is deposited over the substrate 74 and field oxide 76. The dielectric layer 78 may be borophosphosilicate glass (BPSG), for example. The dielectric layer 78 may be disposed at a thickness of about 4000 angstroms to about 15,000 angstroms, for example. The dielectric layer 78 may be patterned and etched to provide openings such that contacts 80 and 82 (or local interconnects) made from a conductive contact material, such as tungsten (W), can be disposed therein. As can be appreciated, the contacts 80 and 82 are used to provide electrical paths to the integrated circuits (not shown) fabricated on and/or in the substrate 74. After the contact material, such as tungsten (W), is disposed, a planarization process, such as CMP, may be used to planarize the tungsten, thereby forming the structure 72.

Figure 5:
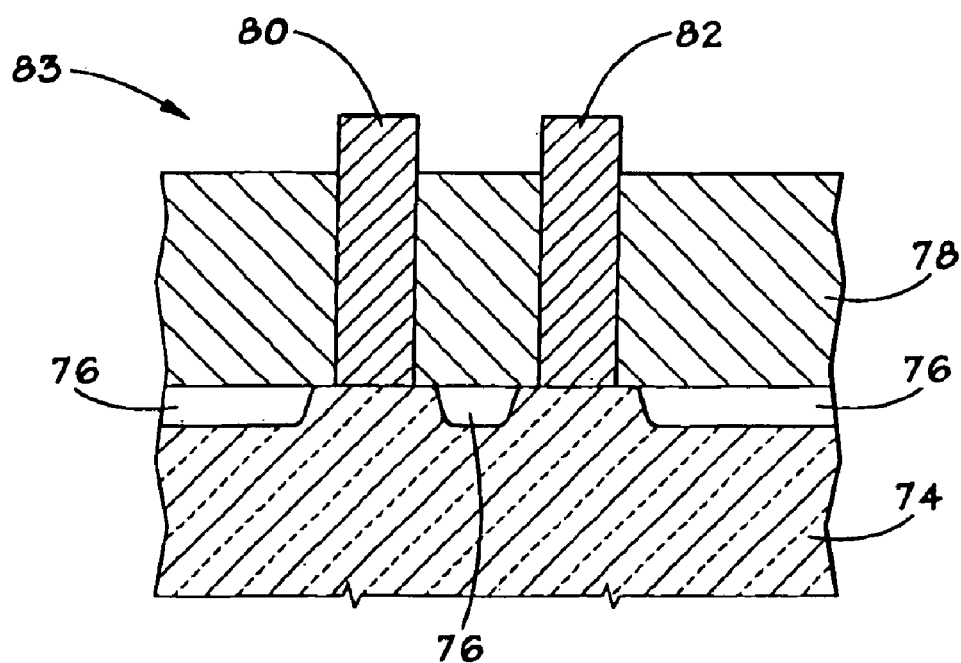

FIGS. 5–8 illustrate an exemplary technique for fabricating the additional capacitors in the present structure 72. As can be appreciated, a low resolution photomask may be used to isolate the memory cell regions of the memory array from other circuits on the memory chip such that capacitance is advantageously added only to the memory array. FIG. 5 illustrates the structure 72 after a portion of the dielectric layer 78 has been etched. The etchant used to etch the dielectric layer 78 may be selective to the contact material disposed within the contacts 80 and 82. In the present exemplary embodiment, the BPSG etchant may be selective to tungsten (W) such that the dielectric layer 78 is etched at a much faster rate than the tungsten. The result of the selective etch is the structure 83 illustrated in FIG. 5. The timing of the BPSG etch may be varied to control the amount of contact material that is left exposed after the etch. In one exemplary embodiment, the dielectric layer 78 is etched such that about 1000 angstroms to about 2000 angstroms of the dielectric layer 78 is removed. As will be explained further below, the depth of the BPSG etch may affect the capacitance added to the memory cell 40 in accordance with the present techniques.

Figure 6:
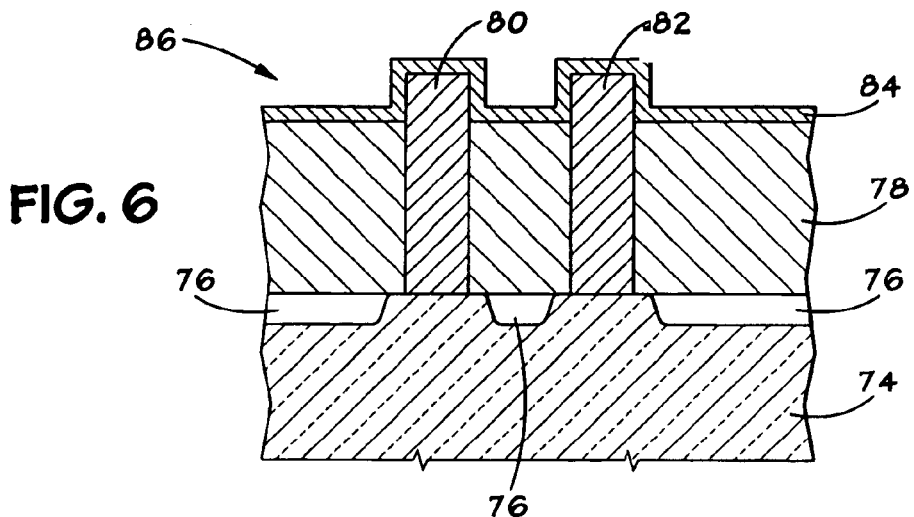

After the partial etch of the dielectric layer 78 to expose a portion of the contacts 80 and 82, a thin dielectric layer 84 such as an oxide or nitride layer, for example, is disposed as illustrated by the structure 86 in FIG. 6. The thin dielectric layer 84 may be deposited conformally at a thickness of about 100 angstroms by a PECVD process, for example. The thin dielectric layer 84 is used to create sidewall spacers on the exposed portion of the contacts 80 and 82 as described further below.

Figure 7:
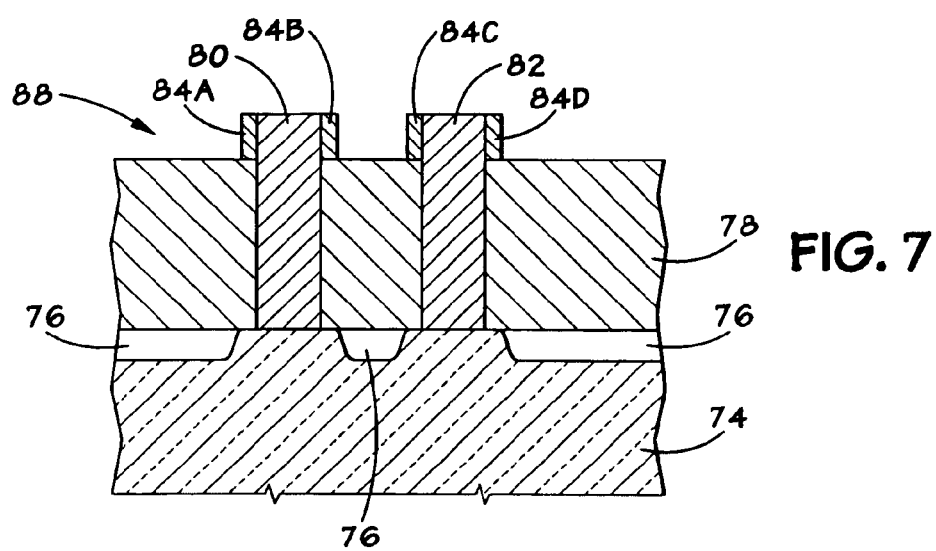

FIG. 7 illustrates the formation of the sidewall spacers 84A–84D. After deposition of the dielectric layer 84, the dielectric layer 84 is etched by a dry etch process, for example, to remove the dielectric layer 84 from the top of the contacts 80 and 82 and from the surface of the second dielectric layer 78. As can be appreciated, the result of the etch is the formation of the dielectric sidewall spacers 84A–84D as illustrated by the structure 88 of FIG. 7. The thickness of the sidewall spacers 84A–84D with respect to the contacts 80 and 82 may be varied depending on the amount of capacitance to be added to the memory cell 40. The thinner the spacers 84A–84D, the more capacitance that will be added to the memory cell 40. It should be noted that the addition of too much capacitance to the memory cell 40 may disadvantageously slow the access time of the memory cell 40.

Figure 8:
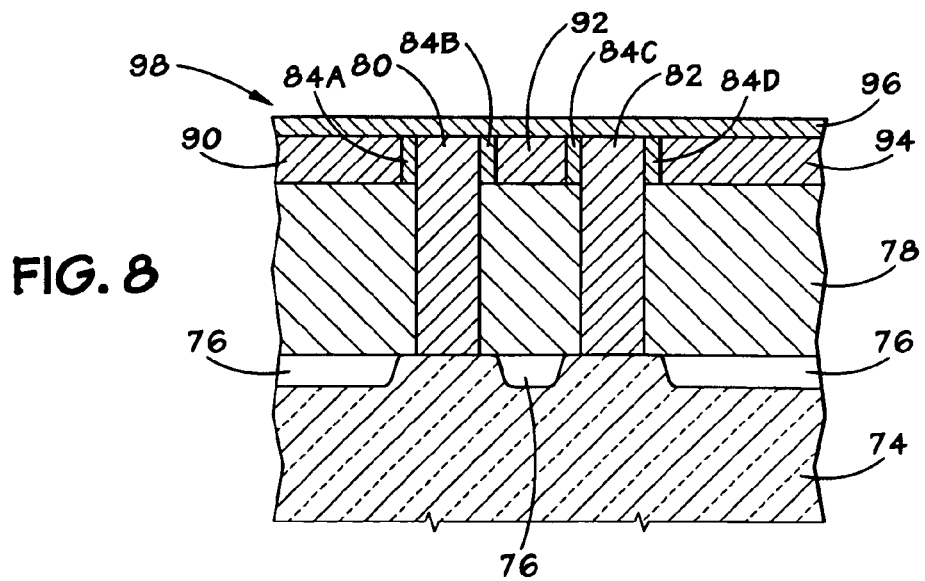

After the formation of the spacers 84A–84D, a layer of metal (not shown), such as tungsten (W), is deposited onto the structure 88 illustrated in FIG. 7. The metal may be deposited by chemical vapor deposition (CVD), for example. Next, the metal layer is planarized, by a chemical mechanical planarization process for example, to form metal fill regions 90, 92 and 94, as illustrated in FIG. 8. As can be appreciated, the metal fill regions 90, 92 and 94 are formed without implementing an additional masking-step because the contacts 80 and 82 provide self-alignment of the metal fill regions 90, 92 and 94. This technique of forming the capacitors is advantageous because additional masking steps may add expense to the fabrication process as well as introduce additional probabilities for the injection of masking anomalies into the structure. As can be appreciated, each of the metal fill regions 90, 92 and 94 may act as an electrode of a capacitor which may advantageously be coupled to the contacts 80 and 82. As can be appreciated, an additional dielectric layer 96, such as an oxide, may be disposed to provide electrical isolation in the structure 98.

As can be appreciated, the addition of the metal fill regions 90, 92 and 94 provided adjacent to the contacts 80 and 82 (separated by the sidewall spacers 84A–84D) provides additional capacitance between the two contacts 80 and 82 and thus, for the memory cell 40 (FIG. 3). These metal fill regions 90, 92 and 94 may be any metal or other suitable conductive material that is separated by the dielectric spacers 84A–84D. Further, though the exemplary embodiment illustrates only two contacts 80 and 82, the present technique may be applied to any number of contacts to further increase the capacitance of the contacts and associated memory cell. Advantageously, no additional masks are required to form the capacitors. Thus, the cost and complexity of fabricating the SRAM cells 40 in accordance with the present techniques are limited. The increase in the cell capacitance may be from 10% to 100%, or more specifically from 30% to 50%. To increase in the cell capacitance further, the size of metal-fill regions 90, 92 and 94 may be increased to provide additional capacitance.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of adding parasitic capacitance to a SRAM cell, the method comprising the acts of:
    (a) partially etching a first dielectric layer from a first conductive node and a second conductive node to expose a portion of each of the first conductive node and the second conductive node;
    (b) forming a respective second dielectric layer on each side of each exposed portion of each of the first conductive node and the second conductive node;
    (c) forming a first conductive element between the respective dielectric layers between the first conductive node and the second conductive node;
    (d) forming a second conductive element adjacent the respective dielectric layer on the side of the first conductive node opposite the second conductive node; and (e) forming a third conductive element adjacent the respective dielectric layer on the side of the second conductive node opposite the first conductive node.

2. The method, as set forth in claim 1, wherein act (a) comprises the act of partially etching the dielectric layer to expose a portion between 1% and 90% of each of the first conductive node and the second conductive node.

3. The method, as set forth in claim 1, wherein act (a) comprises the act of partially etching the dielectric layer to expose a portion between 5% and 40% of each of the first conductive node and the second conductive node.

4. The method, as set forth in claim 1, wherein act (b) comprises the act of forming a spacer on each side of each exposed portion.

5. The method, as set forth in claim 1, wherein act (c) comprises that acts of:

disposing a layer of conductive material; and planarizing the layer of conductive material.

6. The method, as set forth in claim 5, wherein the act of disposing comprises the act of disposing a layer of tungsten.

7. The method, as set forth in claim 1, wherein act (d) comprises that acts of:

disposing a layer of conductive material; and planarizing the layer of conductive material.

8. The method, as set forth in claim 7, wherein the act of disposing comprises the act of disposing a layer of tungsten.

9. The method, as set forth in claim 1, wherein act (e) comprises that acts of:

disposing a layer of conductive material; and planarizing the layer of conductive material.

10. The method, as set forth in claim 9, wherein the act of disposing comprises the act of disposing a layer of tungsten.

11. The method, as set forth in claim 1, wherein acts (c), (d) and (e) are performed simultaneously.

12. The method, as set forth in claim 1, wherein each of the first conductive node and the second conductive node comprises tungsten.

13. The method, as set forth in claim 1, comprising the act of disposing a dielectric layer over each of the first conductive node, the second conductive node, the first conductive element, the second conductive element, the third conductive element, and each of the respective second dielectric layers.

14. The method, as set forth in claim 1, wherein acts (c), (d) and (e) comprise the act of forming three capacitors.

15. The method, as set forth in claim 1, wherein the acts are performed in the recited order.

16. A method of adding parasitic capacitance to an SRAM cell, the method comprising the acts of:

(a) partially exposing a portion of a first conductive node and a second conductive node;

(b) forming dielectric spacers on each side of the first conductive node and on each side of the second conductive node, such that a space is formed between the respective dielectric spacers formed between the first conductive node and the second conductive node;

(c) forming a first conductive element between the respective dielectric spacers formed between the first conductive node and the second conductive node;

(d) forming a second conductive element adjacent the respective dielectric spacer on the side of the first conductive node opposite the second conductive node; and (e) forming a third conductive element adjacent the respective dielectric space on the side of the second conductive node opposite the first conductive node.

17. The method, as set forth in claim 16, wherein act (a) comprises the act of partially exposing a portion between 1% and 90% of each of the first conductive node and the second conductive node.

18. The method, as set forth in claim 16, wherein act (a) comprises the act of partially exposing a portion between 5% and 40% of each of the first conductive node and the second conductive node.

19. The method, as set forth in claim 16, wherein act (c) comprises that acts of:

disposing a layer of conductive material; and planarizing the layer of conductive material.

20. The method, as set forth in claim 19, wherein the act of disposing comprises the act of disposing a layer of tungsten.

21. The method, as set forth in claim 16, wherein act (d) comprises that acts of:

disposing a layer of conductive material; and planarizing the layer of conductive material.

22. The method, as set forth in claim 21, wherein the act of disposing comprises the act of disposing a layer of tungsten.

23. The method, as set forth in claim 16, wherein act (e) comprises that acts of:

disposing a layer of conductive material; and planarizing the layer of conductive material.

24. The method, as set forth in claim 23, wherein the act of disposing comprises the act of disposing a layer of tungsten.

25. The method, as set forth in claim 16, wherein acts (c), (d) and (e) are performed simultaneously.

26. The method, as set forth in claim 16, wherein each of the first conductive node and the second conductive node comprises tungsten.

27. The method, as set forth in claim 16, comprising the act of disposing a dielectric layer over each of the first conductive node, the second conductive node, the first conductive element, the second conductive element, the third conductive element, and each of the dielectric spacers.

28. The method, as set forth in claim 16, wherein acts (c), (d) and (e) comprise the act of forming three capacitors.

29. The method, as set forth in claim 16, wherein the acts are performed in the recited order.

* * * * *